(12) United States Patent
Katsunuma et al.

(10) Patent No.: US 11,114,304 B2
(45) Date of Patent: Sep. 7, 2021

(54) SUBSTRATE PROCESSING METHOD

(71) Applicant: TOKYO ELECTRON LIMITED, Tokyo (JP)

(72) Inventors: Takayuki Katsunuma, Miyagi (JP); Toru Hisamatsu, Miyagi (JP); Shinya Ishikawa, Miyagi (JP); Yoshihide Kihara, Miyagi (JP); Masanobu Honda, Miyagi (JP); Maju Tomura, Miyagi (JP); Sho Kumakura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/564,851

(22) Filed: Sep. 9, 2019

(65) Prior Publication Data
US 2020/0176265 A1    Jun. 4, 2020

(30) Foreign Application Priority Data

Nov. 30, 2018 (JP) .............................. JP2018-225461
Apr. 26, 2019 (JP) .............................. JP2019-086812

(51) Int. Cl.
*H01L 21/311* (2006.01)
*H01L 21/02* (2006.01)

(52) U.S. Cl.
CPC .... *H01L 21/31116* (2013.01); *H01L 21/0217* (2013.01); *H01L 21/0228* (2013.01); *H01L 21/02164* (2013.01); *H01L 21/31144* (2013.01)

(58) Field of Classification Search
CPC ......... H01L 21/31116; H01L 21/31144; H01L 21/0228; H01L 21/02164; H01L 21/0217; H01L 21/0337; H01L 21/0335; H01L 21/67103; H01L 21/02063; H01J 37/00
USPC .......................................... 438/706–714, 756
See application file for complete search history.

(56) References Cited

U.S. PATENT DOCUMENTS

| | | | |
|---|---|---|---|
| 8,455,352 B1 * | 6/2013 | Zheng | H01L 21/0206 438/663 |
| 2008/0295872 A1 * | 12/2008 | Riker | H01J 37/32477 134/105 |
| 2012/0156887 A1 * | 6/2012 | Ono | H01L 21/02046 438/706 |
| 2013/0105303 A1 * | 5/2013 | Lubomirsky | H01L 21/3105 204/192.34 |
| 2014/0363979 A1 * | 12/2014 | Or | H01L 21/31116 438/714 |
| 2017/0263438 A1 * | 9/2017 | Li | H01L 21/3086 |

FOREIGN PATENT DOCUMENTS

JP          2010-165954 A         7/2010

* cited by examiner

*Primary Examiner* — Duy Vu N Deo
(74) *Attorney, Agent, or Firm* — Rothwell, Figg, Ernst & Manbeck, P.C.

(57) ABSTRACT

A substrate processing method includes providing a processing target substrate having a pattern, forming a film on the substrate, forming a reaction layer on a surface layer of the substrate by plasma, and removing the reaction layer by applying energy to the substrate.

20 Claims, 20 Drawing Sheets

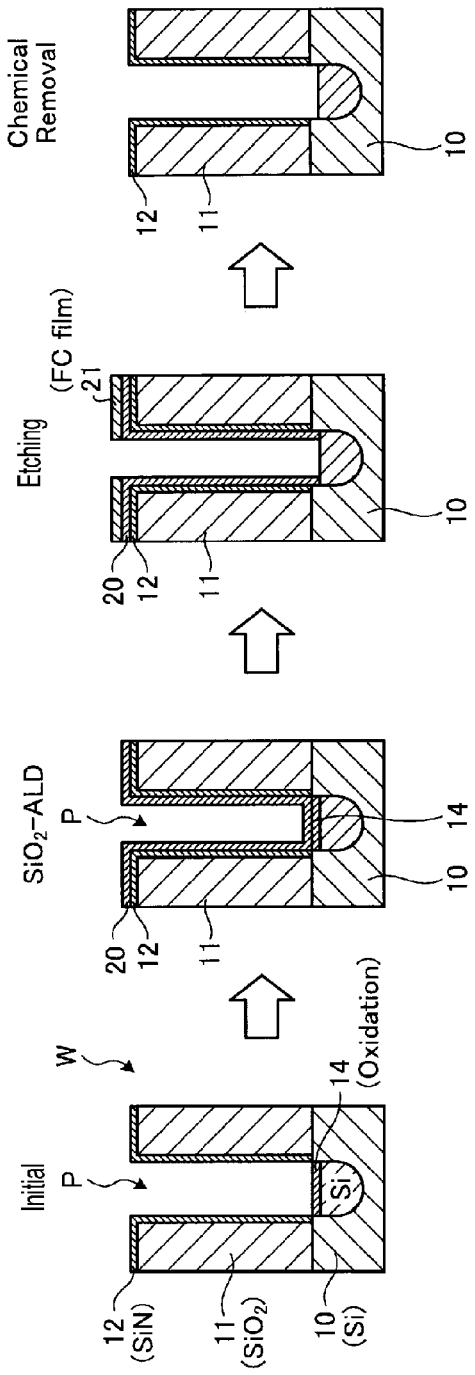

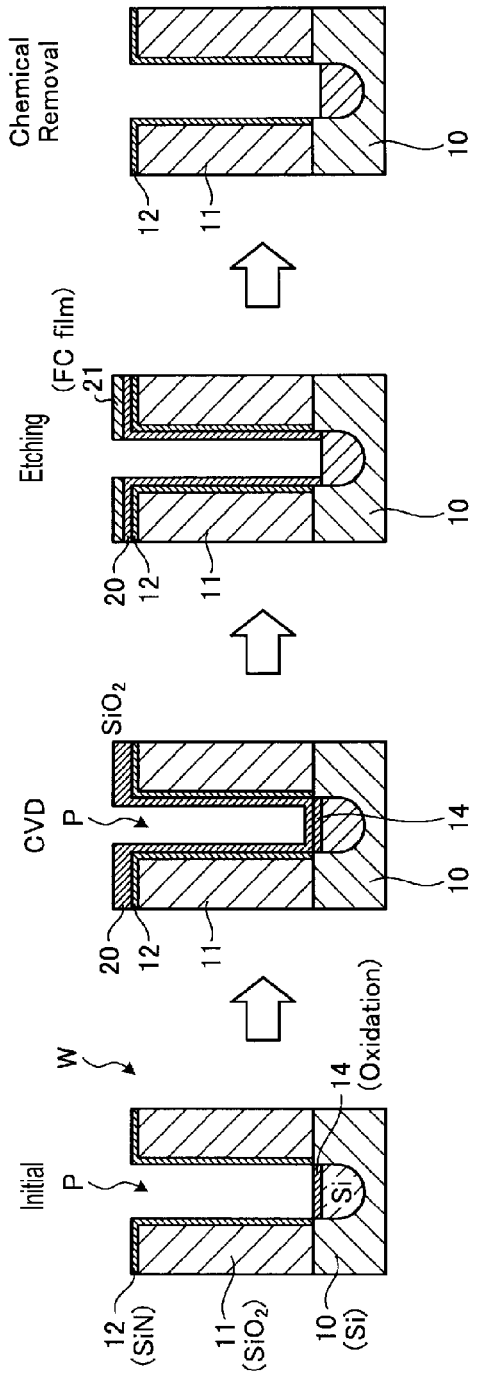

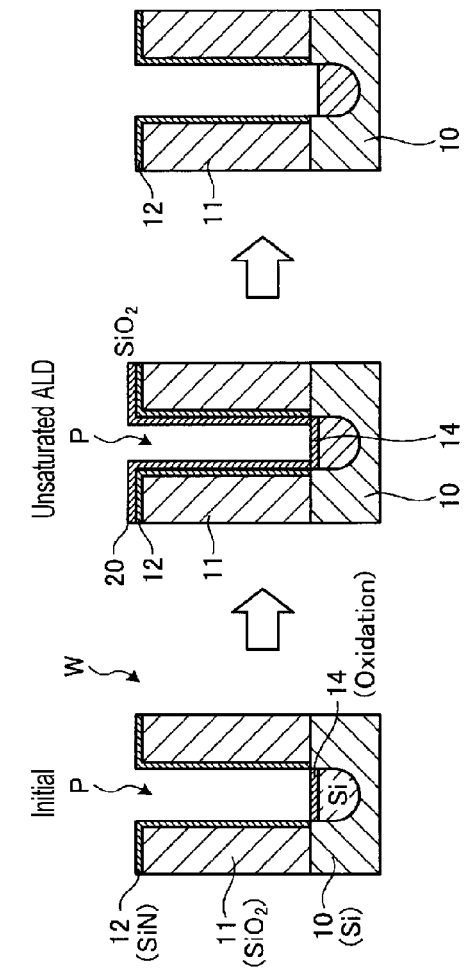

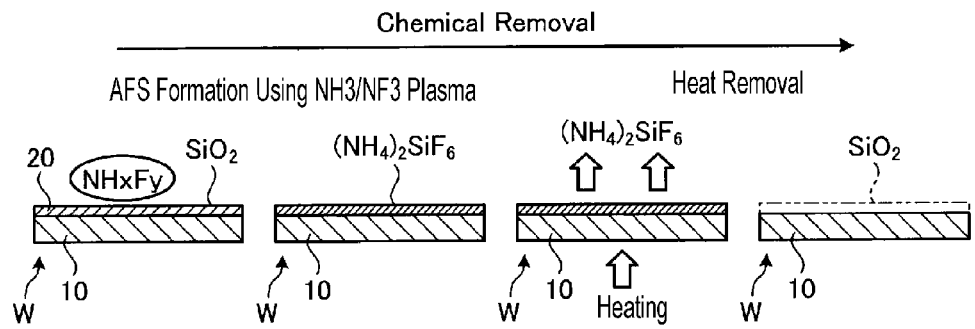
FIG. 7A    FIG. 7B    FIG. 7C    FIG. 7D
FIG. 8
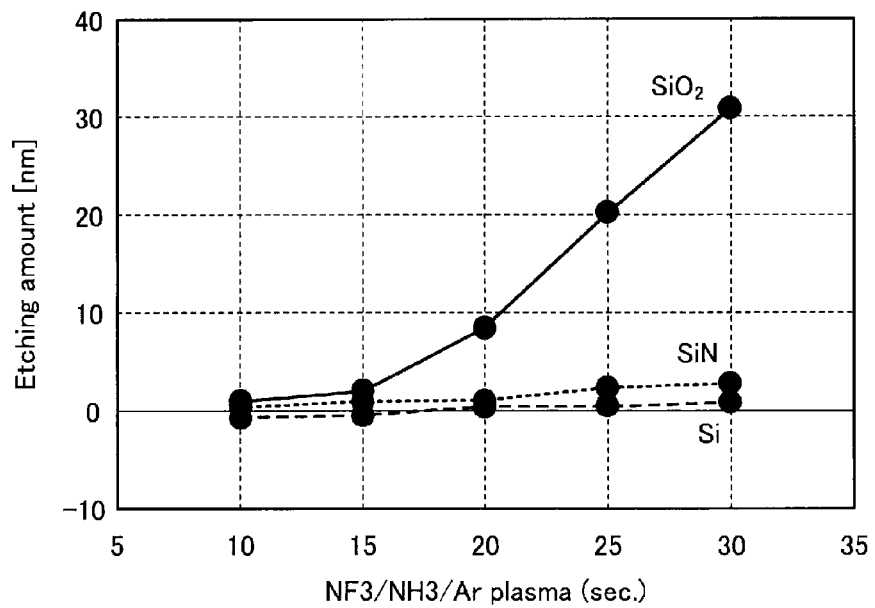

FIG. 11A    FIG. 11B    FIG. 11C
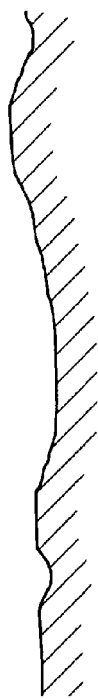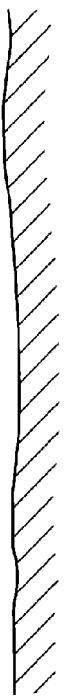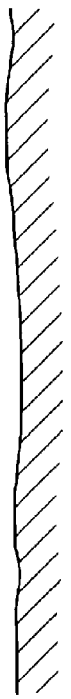

FIG. 14A     FIG. 14B
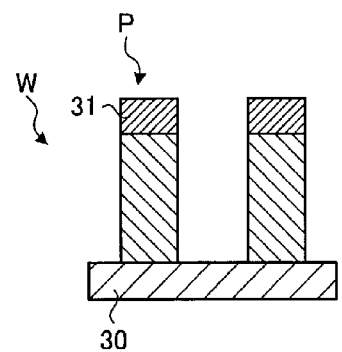 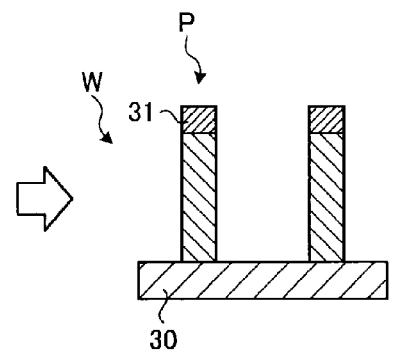
FIG. 15A     FIG. 15B     FIG. 15C
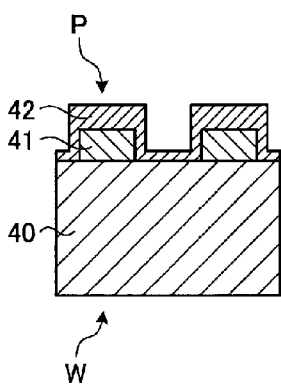 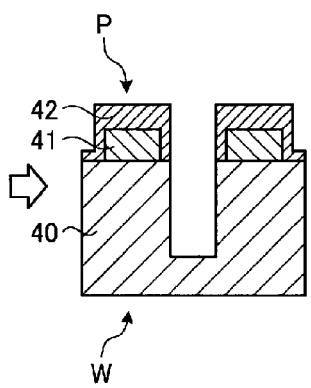 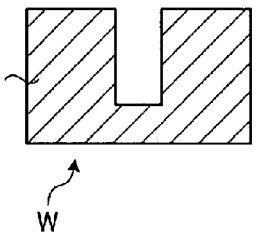

FIG. 16A  FIG. 16B  FIG. 16C
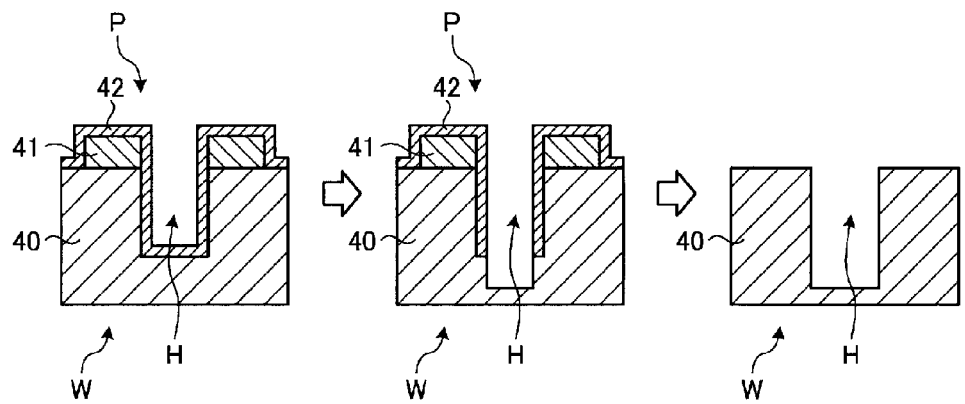
FIG. 17
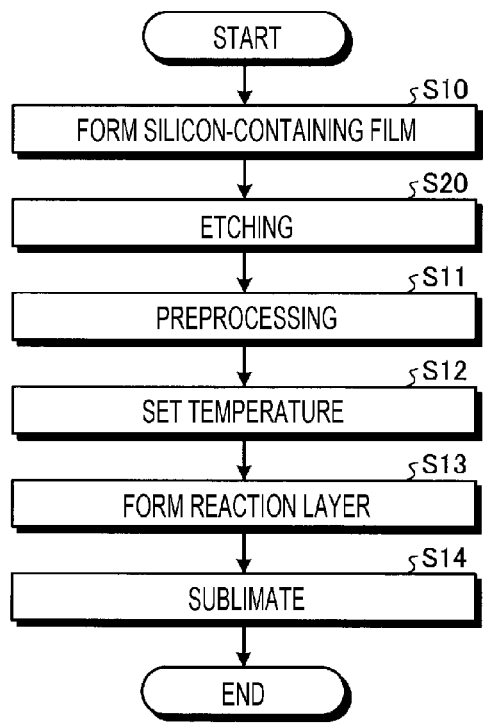

FIG. 19A   FIG. 19B   FIG. 19C
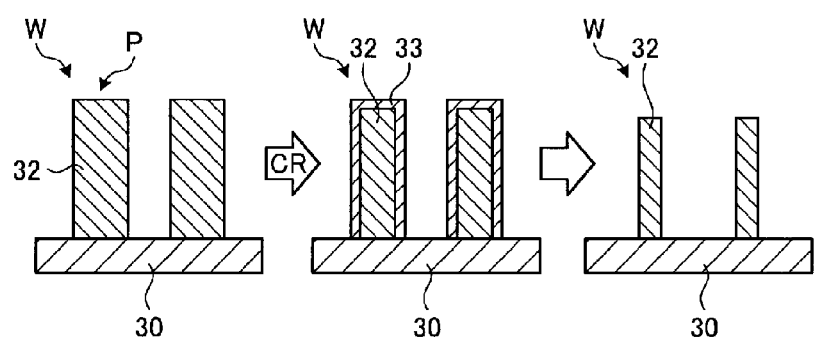

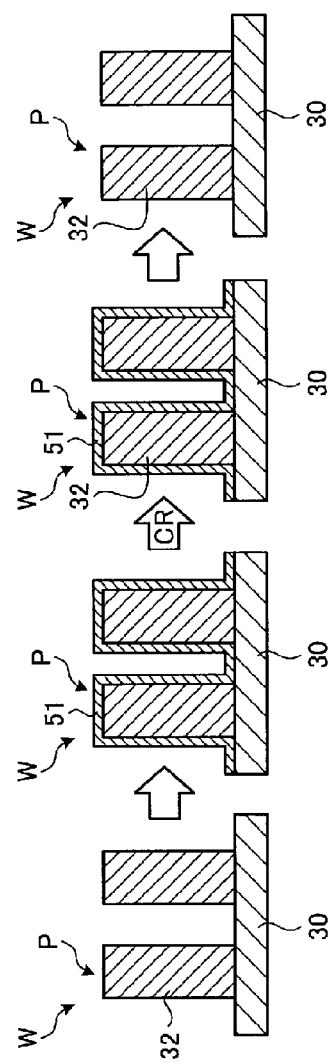

FIG. 26
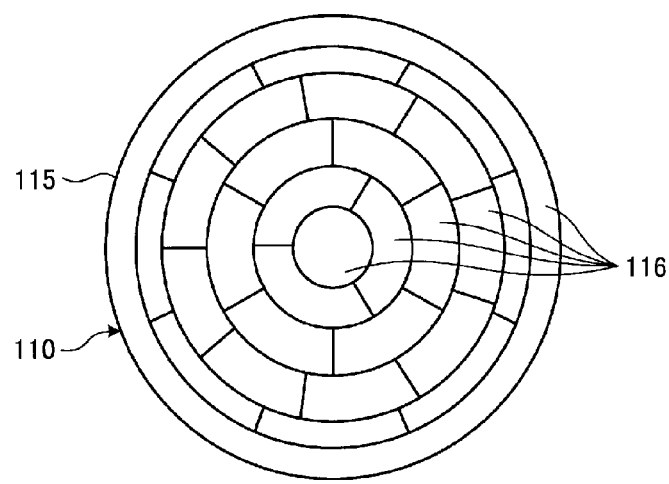
FIG. 27A
FIG. 27B
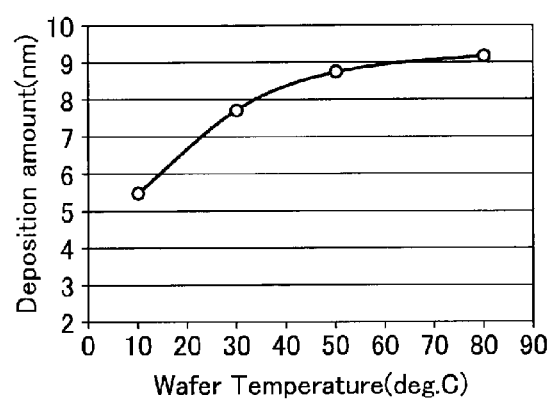
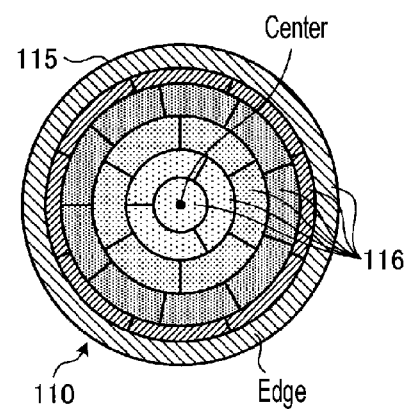

SUBSTRATE PROCESSING METHOD

CROSS-REFERENCE TO RELATED APPLICATIONS

This application is based on and claims priority from Japanese Patent Application Nos. 2018-225461 and 2019-086812, filed on Nov. 30, 2018 and Apr. 26, 2019, respectively, with the Japan Patent Office, the disclosures of which are incorporated herein in their entireties by reference.

TECHNICAL FIELD

The present disclosure relates to a substrate processing method.

BACKGROUND

Japanese Patent Laid-open Publication No. 2010-165954 discloses a technique for removing (etching) a native oxide film on a wafer. The technique forms a reaction layer by reacting the native oxide film on the wafer with a processing gas, and then heats the wafer to sublimate the reaction layer thereby removing (etching) the native oxide film.

SUMMARY

A substrate processing method according to an aspect of the present disclosure includes providing a substrate having a pattern, forming a film on the substrate, forming a reaction layer on a surface layer of the substrate by plasma, and removing the reaction layer by applying energy to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 4A to 4D are views for describing an exemplary flow of a substrate processing for removing an oxide film according to an embodiment.

FIGS. 5A to 5D are views for describing another exemplary flow of a substrate processing for removing an oxide film according to an embodiment.

FIGS. 6A to 6C are views for describing another exemplary flow of a substrate processing for removing an oxide film according to an embodiment.

FIGS. 7A to 7D are views for describing an exemplary flow of a CR processing according to an embodiment.

FIG. 8 is a view representing an etching amount depending on a CR processing according to an embodiment.

FIGS. 11A to 11C are views for explaining improvements in LWR and LER of line-type patterns according to an embodiment.

FIGS. 14A and 14B are views illustrating another exemplary change in the shape of patterns according to the embodiment.

FIGS. 15A to 15C are views illustrating exemplary etching using a film according to an embodiment as a mask.

FIGS. 16A to 16C are views illustrating an exemplary etching using a film according to an embodiment as a protective film.

FIG. 17 is a flowchart illustrating another exemplary flow of a substrate processing according to an embodiment.

FIGS. 19A to 19C are views illustrating an exemplary change in the shape of patterns depending on a CR processing according to an embodiment.

FIGS. 20A to 20D are views illustrating an exemplary change in the shape of patterns depending on a film forming processing and a CR processing according to an embodiment.

FIG. 26 is a view illustrating exemplary zone division of the placement surface of a stage according to an embodiment.

FIGS. 27A and 27B are views for explaining an exemplary relationship between the temperature and the film forming amount of a processing target according to an embodiment.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of a substrate processing method disclosed herein will be described in detail with reference to the accompanying drawings. However, the substrate processing method disclosed herein is not limited by the embodiments.

[Configuration of Apparatus]

An exemplary apparatus used for substrate processing according to the present embodiment will be described. Hereinafter, a case where a substrate processing according to the present embodiment is performed using a plasma processing apparatus and a heating apparatus will be described as an example.

Figure 1:
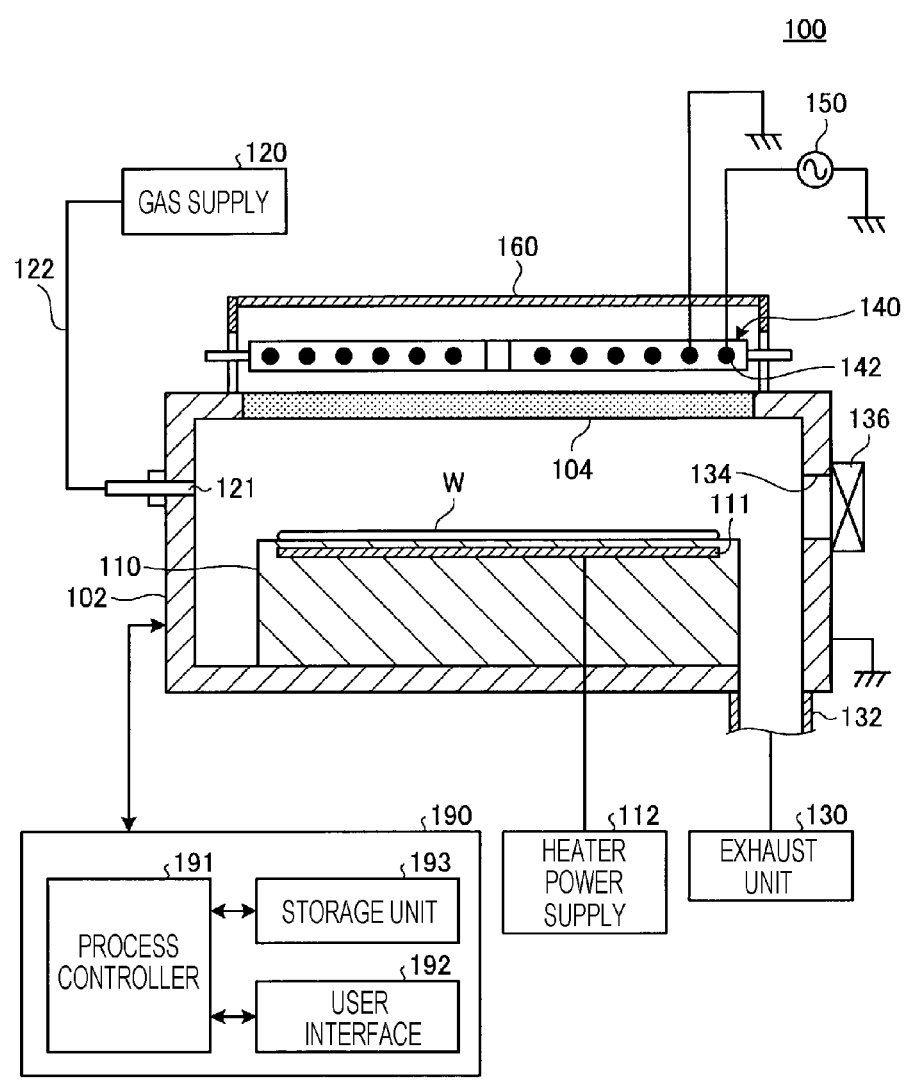
FIG. 1 is a view illustrating an exemplary schematic configuration of a plasma processing apparatus according to an embodiment.

First, an exemplary configuration of a plasma processing apparatus according to the present embodiment will be described. FIG. 1 is a view illustrating an exemplary schematic configuration of a plasma processing apparatus according to an embodiment. In the present embodiment, a case where a plasma processing apparatus 100 is an inductively coupled plasma (ICP) type plasma processing apparatus will be described as an example.

The plasma processing apparatus 100 includes a tubular processing chamber 102 made of a metal (e.g., aluminum).

On the bottom of the processing chamber 102, a stage 110 is provided to place a semiconductor wafer (hereinafter, referred to as a "wafer") W thereon. The stage 110 is formed in a cylindrical shape using, for example, aluminum. The stage 110 is provided with a heater 111. The heater 111 is connected to the heater power supply 112 and generates heat by power supplied from a heater power supply 112. The stage 110 controls the temperature of the wafer W by the heater 111. Although not illustrated, the stage 110 may be provided with necessary functions such as, for example, an electrostatic chuck for attracting and holding the wafer W by electrostatic force and a temperature adjustment mechanism such as, for example, a coolant flow path. When the plasma processing apparatus 100 is used as an etching apparatus, a radio-frequency bias for drawing ions into the wafer W is applied to the stage 110.

A plate-shaped dielectric body 104 made of, for example, quartz glass or ceramic is provided on the ceiling of the processing chamber 102 to face the stage 110. Specifically, the dielectric body 104 is formed, for example, in a disk shape, and is hermetically attached so as to close an opening formed in the ceiling of the processing chamber 102.

A gas supply 120 is connected to the processing chamber 102 to supply various gases used for processing the wafer W. A gas inlet 121 is formed in the side wall of the processing chamber 102. The gas supply 120 is connected to the gas inlet 121 through a gas supply pipe 122.

The gas supply 120 is connected to gas supply sources of various gases used to process the wafer W through gas supply lines, respectively. Each gas supply line branches appropriately to correspond to a substrate processing process, and is provided with an opening/closing valve and a flow rate controller. The gas supply 120 is configured to control the flow rates of various gases by controlling the opening/closing valve and the flow rate controller provided in each gas supply line. The gas supply 120 supplies various gases to the gas inlet 121 depending on the substrate processing process. The various gases supplied to the gas inlet 121 are supplied into the processing chamber 102 from the gas inlet 121. In addition, although FIG. 1 illustrates a case where the gas supply 120 is configured to supply the gases from the side wall of the processing chamber 102 as an example, the present disclosure is not necessarily limited thereto. For example, the gas supply 120 may be configured to supply the gases from the ceiling of the processing chamber 102. In this case, for example, a gas inlet may be formed in the central portion of the dielectric body 104 so that the gases may be supplied from the central portion of the dielectric body 104.

An exhaust unit 130 configured to exhaust the atmosphere in the processing chamber 102 is connected to the bottom of the processing chamber 102 through an exhaust pipe 132. The exhaust unit 130 is constituted with, for example, a vacuum pump, and is configured to reduce the pressure in the processing chamber 102 to a predetermined pressure. A wafer loading/unloading port 134 is formed in the side wall of the processing chamber 102. The wafer loading/unloading port 134 is provided with a gate valve 136. For example, when a wafer W is loaded, the gate valve 136 is opened so as to place the wafer W on the stage 110 in the processing chamber 102 by a transport mechanism such as, for example, a transport arm (not illustrated), and the gate valve 136 is closed so as to process the wafer.

A planar radio-frequency antenna 140 and a shield member 160 covering the radio-frequency antenna 140 are disposed on the upper side surface (outer surface) of the dielectric body 104 in the ceiling of the processing chamber 102. The radio-frequency antenna 140 is provided with an antenna element 142. The antenna element is formed in a spiral coil shape using a conductor such as, for example, copper, aluminum, or stainless steel. A radio-frequency power supply 150 is connected to the antenna element 142. The radio-frequency power supply 150 supplies radio frequency waves of a predetermined frequency (e.g., 40 MHz) to the antenna element 142, which generates plasma, at predetermined power. The radio-frequency waves output from the radio-frequency power supply is not limited to the frequency described above. For example, radio-frequency waves of various frequencies such as, for example, 13.56 MHz, 27 MHz, 40 MHz, and 60 MHz, may be supplied.

When radio-frequency power is supplied to the antenna element 142 from the radio-frequency power supply 150, an induction magnetic field is formed in the processing chamber 102. The formed induction magnetic field excites the processing gas introduced into the processing chamber 102 to generate plasma on the wafer W. The radio-frequency antenna 140 may be provided with a plurality of antenna elements 142, and radio-frequency waves of the same frequency or different frequencies may be applied to the antenna elements 142 from the radio-frequency power supply 150. For example, in the plasma processing apparatus 100, the radio frequency antenna 140 may be divided into a central portion and a peripheral portion of the dielectric antenna 104, the antenna elements 142 may be provided in the central portion and the peripheral portion of the dielectric body 104, respectively, and plasma may be controlled in each of the central portion and the peripheral portion of the dielectric body 104. In the plasma processing apparatus 100, in addition to the radio-frequency antenna 140 provided on the ceiling of the processing chamber 102, radio-frequency power may be supplied to a lower electrode constituting the stage 110 to generate plasma.

The plasma processing apparatus 100 may perform a plasma processing such as, for example, etching and film formation, on a wafer W by the generated plasma.

The operation of the plasma processing apparatus 100 configured as described is totally controlled by a controller 190. The controller 190 includes a process controller 191 that includes a CPU and controls each unit of the plasma processing apparatus 100, a user interface 192, and a storage unit 193.

The process controller 191 controls various operations of the plasma processing apparatus 100. For example, the process controller 191 controls the operation of supplying various gases from the gas supply 120. The process controller 191 also controls the frequency and power of radio-frequency waves supplied from the radio-frequency power supply 150 to the antenna element 142. In addition, the process controller 191 controls the power supplied from a heater power supply 112 to the heater 111 to control the calorific value of the heater 111, thereby controlling the temperature of the wafer W.

The user interface 192 includes, for example, a keyboard configured to allow an operator to input commands for managing the plasma processing apparatus 100 therethrough, and a display configured to visualize and display an operation situation of the plasma processing apparatus 100.

The storage unit 193 stores, for example, a control program (software) for implementing various processings executed in the plasma processing apparatus 100 under the control of the process controller 191, and recipes storing, for example, processing condition data. Then, as required, an arbitrary recipe is called from the storage unit 193 using, for example, a command from the user interface 192 and is executed in the process controller 191, so that a desired processing in the plasma processing system 100 is performed under the control of the process controller 191. In addition, the control program and the recipes of, for example, the processing condition data may be used in the state of being stored in a computer-readable storage medium, or may be used online by causing the control program and the recipes to be transmitted from another device via, for example, a dedicated line at any time. As the computer-readable storage medium, for example, a hard disk, a CD, a flexible disk, or semiconductor memory may be mentioned.

Figure 2:
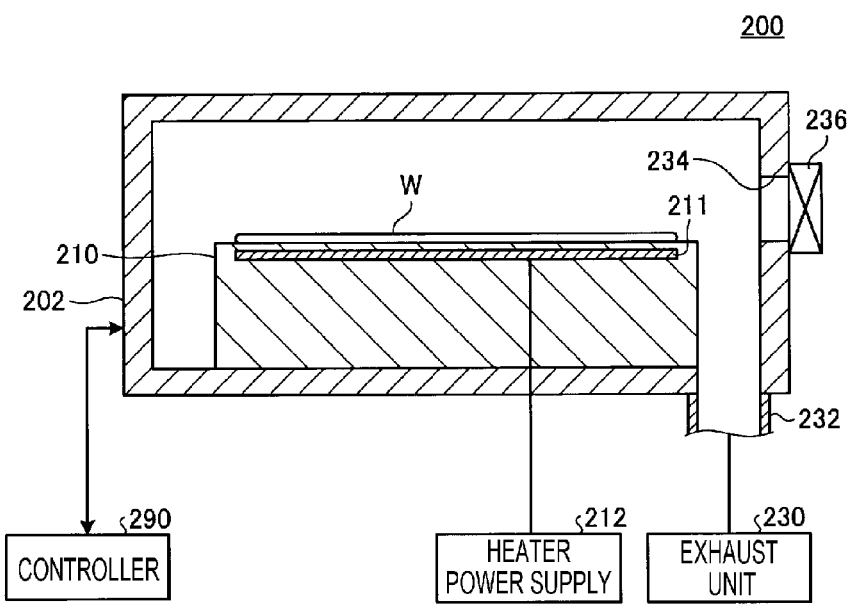
FIG. 2 is a diagram illustrating an exemplary schematic configuration of a heating apparatus according to an embodiment.

Next, an exemplary configuration of a heating apparatus according to the present embodiment will be described. FIG. 2 is a diagram illustrating an exemplary schematic configuration of a heating apparatus according to an embodiment. In the present embodiment, a heating apparatus 200 is separately provided from the plasma processing apparatus 100 illustrated in FIG. 1, and a wafer W is transported to the heating apparatus 200 and the plasma processing apparatus 100 by a transport mechanism such as, for example, a transport arm (not illustrated).

The heating apparatus 200 includes a tubular (e.g., cylindrical) processing chamber 202 made of a metal (e.g., aluminum).

On the bottom of the processing chamber 202, a stage 210 is provided to place a wafer W thereon. The stage 210 is formed in a cylindrical shape using, for example, aluminum. The stage 210 is provided with a heater 211. The heater 211 is connected to a heater power supply 212, and generates heat by power supplied from the heater power supply 212. The stage 210 controls the temperature of the wafer W by the heater 211. Although not illustrated, the stage 210 may be provided with various functions as needed, such as, for example, an electrostatic chuck configured to attract and hold a wafer W by electrostatic force.

An exhaust unit 230 configured to exhaust the atmosphere in the processing chamber 202 is connected to the bottom of the processing chamber 202 through an exhaust pipe 232. The exhaust unit 230 is constituted with, for example, a vacuum pump, and is configured to reduce the pressure in the processing chamber 202 to a predetermined pressure. A wafer loading/unloading port 234 is formed in the side wall of the processing chamber 202. The wafer loading/unloading port 234 is provided with a gate valve 236. For example, when a wafer W is loaded, the gate valve 236 is opened so as to place the wafer W on the stage 210 in the processing chamber 202 by a transport mechanism such as, for example, a transport arm (not illustrated), and the gate valve 236 is closed so as to process the wafer.

The heating apparatus 200 performs a heating processing for heating the wafer W placed on the stage 210 by the heater 211.

The operation of the plasma heating apparatus 200 configured as described is totally controlled by a controller 290. The controller 290 is, for example, a computer, and includes, for example, a central processing unit (CPU), random access memory (RAM), read only memory (ROM), and an auxiliary storage device. The CPU operates on the basis of a program stored in the ROM or the auxiliary storage device or a process condition of plasma processing so as to control the operations of the entire apparatus. In addition, the controller 290 may be provided inside or outside the heating apparatus 200. In a case where the controller 290 is provided outside the film-forming apparatus 200, the controller 290 is capable of controlling the heating apparatus 200 through, for example, a wired or wireless communication mechanism.

Next, a substrate processing method according to the present embodiment will be described. When manufacturing a semiconductor device, a native oxide film may be formed on the wafer W. It may be necessary to remove this native oxide film.

Figure 3:
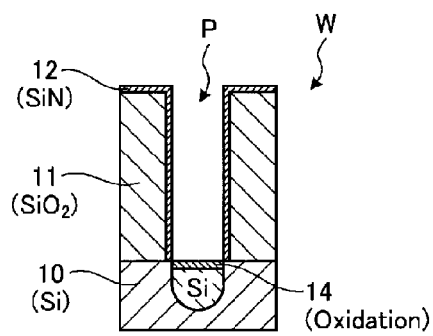
FIG. 3 is a view illustrating an exemplary wafer having an oxide film formed thereon.

FIG. 3 is a view illustrating an exemplary wafer having an oxide film formed thereon. In the wafer W, a $SiO_2$ film 11 is provided on a silicon (Si) layer 10 serving as a base. A pattern P is formed on the $SiO_2$ film 11. In FIG. 3, as the pattern P, an opening reaching the Si layer 10 is formed in the $SiO_2$ film 11. In the wafer W, the top surface of the $SiO_2$ film 11 and the side surfaces of the pattern P are covered with a SiN film 12. In the wafer W, a native oxide film 14 ($SiO_2$) is formed on the Si layer 10 at the bottom where the pattern P is formed. The Si layer 10 is shown by changing the pattern because the lower portion of the native oxide film 14 is changed to, for example, silicon germanium. It is conceivable to remove the native oxide film 14 while maintaining the SiN film 12 using, for example, the technique of Patent Document 1.

However, the SiN film 12 may be damaged in, for example, the previous step. In that case, for example, when the technique of Patent Document 1 is used, the SiN film 12 is removed.

Therefore, in the present embodiment, the following substrate processing is performed to remove an oxide film such as, for example, the native oxide film 14. FIGS. 4A to 4D are views for describing an exemplary flow of a substrate processing for removing an oxide film according to an embodiment. FIG. 4A illustrates a wafer W having a native oxide film 14 formed thereon as in FIG. 3.

First, a silicon-containing film is formed on the wafer W. For example, as illustrated in FIG. 4B, a $SiO_2$ film 20 is formed on the wafer W through atomic layer deposition (ALD). For example, the plasma processing apparatus 100 supplies a source gas containing silicon (Si) from the gas supply 120 to the processing chamber 102 so that the source gas is adsorbed onto the surface of the wafer W. The adsorption amount of the source gas adsorbed to the wafer W increases and saturates with the supply time. The term "saturation" as used herein refers to a state in which chemical adsorption proceeds to the outermost surface and thus no further progress in chemical adsorption, or a state in which all the adsorption sites are occupied and thus adsorption does not proceed. Next, the plasma processing apparatus 100 supplies a reaction gas from the gas supply 120 to the processing chamber 102, and applies radio-frequency power from the radio-frequency power supply 150 to the antenna element 142 to generate plasma. As a result, the reaction gas is activated, and the source gas adsorbed onto the wafer W is modified by active species of the reaction gas to form a film. As the source gas, for example, tri(dimethylamino) silane (TDMAS) or bis(diethylamino)silane (BDEAS) is used. As the reaction gas, an oxidizing gas such as, for example, oxygen ($O_2$) gas may be used. The reaction gas is turned into plasma and supplied to the wafer W. When film formation is performed using ALD, the plasma processing apparatus 100 forms a thin film having a desired film thickness by repeating a cycle of alternately supplying the source gas and the reaction gas multiple times. In the ALD, since the adsorption amount of the source gas adsorbed onto the wafer W is saturated, it is possible to uniformly form a film on the top surface, the side surfaces, and the bottom surface of the pattern P.

Next, plasma is generated using an etching gas (e.g., fluorocarbon gas), anisotropic etching is performed on the wafer W to etch back the ALD film ($SiO_2$ film 20). The plasma processing apparatus 100 supplies fluorocarbon gas ($C_xF_y$) such as, for example, $C_4F_8$ gas from the gas supply 120 to the processing chamber 102, and applies radio-frequency power from the radio-frequency power supply 150 to the antenna element 142 to form plasma to perform etching. When etching is performed using the fluorocarbon gas, many deposits are generated on the surface of the wafer W and thus a film 21 is formed. Meanwhile, as illustrated in FIG. 4C, the $SiO_2$ film 20 and the native oxide film 14 at the bottom of the pattern P are etched and removed.

Next, a chemical removal (CR) processing is performed to remove the ALD film ($SiO_2$ film 20). The CR processing is a processing of removing (etching) a removal target by a chemical reaction. Details of the CR processing will be described later. As a result, as illustrated in FIG. 4D, even when the SiN film 12 is damaged, it is possible to remove the native oxide film 14 while suppressing the removal of the SiN film 12.

In the example of FIGS. 4A to 4D, in order to selectively form the $SiO_2$ film 20 in the area other than the bottom of the pattern P, which becomes a non-etching target in the wafer W, the $SiO_2$ film 20 is formed isotropically through ALD, and then etched back by anisotropic etching. However, the film forming method is not limited to the ALD, and any method may be used. For example, the film forming method may be chemical vapor deposition (CVD), physical vapor deposition (PVD), direct current superposition (DCS), or unsaturated ALD. The unsaturated ALD is ALD that does not saturate the adsorption of the source gas, or does not saturate the modification of the source gas adsorbed onto the wafer W, or does not saturate the adsorption of the source gas and the modification of the source gas adsorbed onto the wafer W. In addition to the case where the source gas is not adsorbed onto the entire surface, the unsaturated ALD includes a case where the source gas is not completely reformed. The DCS is a film forming method in which an electrode material is sputtered to form a film on a substrate. For example, in the DCS, in the plasma processing apparatus, a negative DC voltage is applied to the upper electrode containing an electrode material to sputter the electrode material to form a film on a substrate. Details of the DCS are disclosed in, for example, US Patent Application Publication No. 2018/0151333.

FIGS. 5A to 5D are views for describing another exemplary flow of a substrate processing for removing an oxide film according to an embodiment. FIG. 5A illustrates a wafer W having a native oxide film 14 formed thereon as in FIG. 3.

First, a silicon-containing film is formed on a wafer W. For example, as illustrated in FIG. 5B, a $SiO_2$ film 20 is formed on the wafer W through chemical vapor deposition (CVD). For example, the plasma processing apparatus 100 supplies, for example, $SiCl_4$ gas and $O_2$ gas from the gas supply 120 to the processing chamber 102, and applies radio-frequency power from the radio-frequency power supply 150 to the antenna element 142 to form plasma, thereby forming the $SiO_2$ film 20 on the wafer W.

Next, plasma is generated using, for example, fluorocarbon gas, and anisotropic etching is performed on the wafer W to etch back the $SiO_2$ film 20. Therefore, as illustrated in FIG. 5C, the $SiO_2$ film 20 and the native oxide film 14 at the bottom of the pattern P are mainly etched and removed.

Next, a CR processing is performed to remove the $SiO_2$ film 20. Details of the CR processing will be described later. As a result, as illustrated in FIG. 5D, even when the SiN film 12 is damaged, it is possible to remove the native oxide film 14 while suppressing the removal of the SiN film 12.

FIGS. 6A to 6C are views for describing another exemplary flow of a substrate processing for removing an oxide film according to an embodiment. FIG. 6A illustrates a wafer W having a native oxide film 14 formed thereon as in FIG. 3.

First, a silicon-containing film is formed on a wafer W. For example, as illustrated in FIG. 6B, a $SiO_2$ film 20 is formed on the wafer W through unsaturated ALD. In the unsaturated ALD, the $SiO_2$ film 20 is formed on the surface of the wafer W and the side surfaces of the pattern P. Therefore, it is possible to selectively form the $SiO_2$ film 20 in an area other than the bottom of the pattern P, which becomes a non-etching target in the wafer W, without performing etch back.

Next, a CR processing is performed to remove the $SiO_2$ film 20. Details of the CR processing will be described later. As a result, as illustrated in FIG. 6C, even when the SiN film 12 is damaged, it is possible to remove the native oxide film 14 while suppressing the removal of the SiN film 12.

Next, a CR processing according to the present embodiment will be described. FIGS. 7A to 7D are views for describing an exemplary flow of a CR processing according to an embodiment. The wafer W illustrate in FIG. 7A is provided with a $SiO_2$ film 20 on a Si layer 10 serving as a base.

First, a reaction layer is formed by plasma on the surface layer of the wafer W on which the $SiO_2$ film 20 is provided. The plasma processing apparatus 100 introduces a gas such as, for example, $NF_3$ gas, $NH_3$ gas, or Ar gas from the gas supply 120 to generate plasma. As a result, as illustrated in FIG. 7A, $NH_xF_y$ is generated. For example, $NH_xF_y$ (e.g., $NH_4F$, $NH_4 \cdot HF$) is generated by the following reaction.

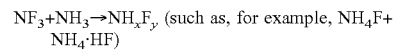

$NF_3 + NH_3 \rightarrow NH_xF_y$ (such as, for example, $NH_4F + NH_4 \cdot HF$)

The generated $NH_4F$ and $NH_4 \cdot HF$ react with a $SiO_2$ film as follows, and as illustrated in FIG. 7B, $(NH_4)_2SiF_6$ (ammonium fluorosilicate) is formed as a reaction. Hereinafter, $(NH_4)_2SiF_6$ is also referred to as "AFS." In the CR processing, AFS may be formed only by gas supply, for example, the AFS may be formed by supplying HF gas and $NH_3$ gas.

When an AFS film is formed using plasma, the reaction speed is capable of being improved, and when an AFS film is formed without using plasma, the film is capable of being formed without damage.

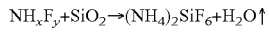

The AFS sublimates when temperature rises above 100° C. Therefore, when forming the reaction layer, the wafer W is controlled to a predetermined temperature of 100° C. or lower. The plasma processing apparatus 100 controls the wafer W to a predetermined temperature of 100° C. or lower, for example, by controlling the power supplied from the heater power supply 112 to the heater 111 to control the calorific value of the heater 111.

Next, energy is applied to the wafer W to remove the reaction layer. It is possible to remove the reaction layer by applying energy to the reaction layer by, for example, an electron beam, plasma, heat, or microwaves. For example, as illustrated in FIG. 7C, the wafer W is heated to remove the reaction layer. In the present embodiment, the wafer W is heated to a predetermined temperature of 100° C. or higher (e.g., 300° C.). As a result, the following reaction occurs so that $(NH_4)_2SiF_6$ sublimates. Therefore, the film (e.g., the $SiO_2$ film 20) is removed from the wafer W. The reaction layer may be removed by applying energy using, for example, electron beams, plasma, or microwaves.

Here, when the wafer W is heated to, for example, 300° C. by the plasma processing apparatus 100, the temperature of the stage 110 also becomes high, and it takes a long time until the substrate processing is capable of being performed on the next wafer W, which results in reduction of productivity. The wafer W after the formation of AFS is transported to the heating apparatus 200, and the wafer W is heated by the heating apparatus 200 to a predetermined temperature of 100° C. or higher (e.g., 300° C.). As described above, by performing the substrate processing using the plasma processing apparatus 100 and the heating apparatus 200, it is possible to reduce the time for temperature rise and fall between processings, and thus it is possible to improve the productivity of the substrate processing. In the present embodiment, although a case where a substrate processing is using the plasma processing apparatus 100 and the heating apparatus 200 is described as an example, the present disclosure is not limited thereto. For example, the reaction layer may be removed by heating the wafer W using the plasma processing apparatus 100. Thus, it is possible to perform a substrate processing in a single plasma processing chamber 102.

A CR processing is capable of removing $SiO_2$ at a higher etching rate than the etching rate of Si or SiN. FIG. 8 is a view representing an etching amount depending on a CR processing according to an embodiment. FIG. 8 represents changes in etching amounts of Si, SiN, and $SiO_2$ when a plasma processing time for generating plasma is changed while introducing gases such as, for example, $NF_3$ gas and $NH_3$ gas. As illustrated in FIG. 8, the CR processing is capable of removing $SiO_2$ at a higher etching rate than the etching rate of Si or SiN because the etching amount of $SiO_2$ is larger compared with Si and SiN.

In the CR processing, a preprocessing such as, for example, heating or plasma processing may be performed to remove particles or adjust the state of the wafer W.

Figure 9:
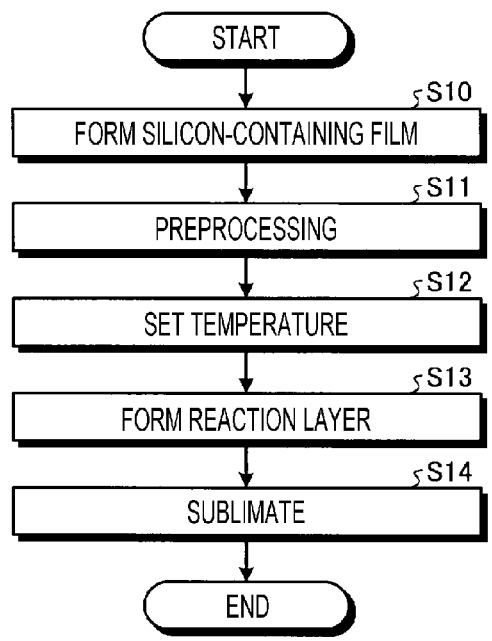
FIG. 9 is a flowchart illustrating an exemplary flow of a substrate processing according to an embodiment.

Next, a flow of a substrate processing according to the present embodiment will be briefly described. FIG. 9 is a flowchart illustrating an exemplary flow of a substrate processing according to an embodiment. When performing a substrate processing, a wafer W is transported by the transport mechanism and provided to the heating apparatus 200 and the plasma processing apparatus 100. A native oxide film 14 is formed on the wafer W, for example, as illustrated in FIG. 3.

A silicon-containing film is formed on the wafer W (step S10). For example, the plasma processing apparatus 100 forms a $SiO_2$ film 20 on the wafer W through ALD. Then, the plasma processing apparatus 100 generates plasma using, for example, fluorocarbon gas, and performs anisotropic etching on the wafer W to etch back the $SiO_2$ film 20. Therefore, the $SiO_2$ film 20 and the native oxide film 14 at the bottom of the pattern P are etched. When, for example, it is possible to form the $SiO_2$ film 20 on the surface of the wafer W or the side surfaces of the pattern P through, for example, unsaturated ALD illustrated in FIGS. 6A to 6C, etch back may not be performed.

Next, in order to adjust the state of the wafer W, a preprocessing such as, for example, heating, plasma processing, or inhibitor adsorption is performed (step S11). For example, the plasma processing apparatus 100 supplies power from the heater power supply 112 to the heater 111 and preheats the wafer W by the heater 111. Next, the wafer W is controlled to a predetermined temperature of 100° C. or lower such that the reaction layer (for example, AFS) does not sublimate (step S12). For example, the plasma processing apparatus 100 controls the wafer W to a predetermined temperature of 100° C. or lower by controlling the power supplied from the heater power supply 112 to the heater 111 to control the calorific value of the heater 111.

Next, a reaction layer is formed on the surface layer of the wafer W (step S13). For example, the plasma processing apparatus 100 introduces various gases such as, for example, $NF_3$ gas, $NH_3$ gas, and Ar gas used for a CR processing from the gas supply 120, and generates plasma. Thus, an AFS layer is formed on the wafer W as a reaction layer.

Next, the wafer W is heated to sublimate the reaction layer (e.g., AFS) to remove the reaction layer (step S14). For example, the wafer W is transported to the heating apparatus 200, and the wafer W is heated by the heating apparatus 200 to a predetermined temperature of 100° C. or higher (e.g., 300° C.). Therefore, the $SiO_2$ film 20 is removed from the wafer W.

Although the flow of performing steps S10 to S14 once is illustrated in the substrate processing according to the present embodiment, steps S10 to S14 may be repeated multiple times as necessary.

As described above, in the substrate processing according to the present embodiment, a silicon-containing film ($SiO_2$) is selectively formed on the first area (an area other than the bottom of the pattern P) in the processing target substrate (wafer W) having a pattern P thereon. Next, in the substrate processing, a reaction layer (AFS) is formed by plasma on the surface layer of the substrate on which the silicon-containing film is formed. Next, in the substrate processing, by heating the substrate to remove the reaction layer, the silicon-containing film formed in the second area (the bottom of the pattern P) other than the first area in the substrate is removed. Thus, the substrate processing according to the present embodiment is capable of removing the silicon-containing film formed in the second area.

In a substrate (wafer W), a pattern P reaching a silicon layer 10 is formed on a $SiO_2$ film 11 provided on the silicon layer 10, and the top surface of the $SiO_2$ film 11 and the side surfaces of the pattern P are covered with a SiN film 12, and a native oxide film 14 is formed on the silicon layer 10 at the bottom of the pattern P. In the substrate processing, a $SiO_2$ film 20 is formed on at least the side surfaces of the pattern P. In the substrate processing, plasma is generated while supplying $NF_3$ gas and $NH_3$ gas, and reacted with the $SiO_2$ film 20 and the native oxide film 14 to form $(NH_4)_2SiF_6$ as a reaction layer. In the substrate processing, the native oxide film 14 is removed by removing the reaction layer. As a result, according to the substrate processing of the present embodiment, even when the SiN film 12 is damaged, it is possible to remove the native oxide film 14 while suppressing the removal of the SiN film 12.

In addition, in a substrate processing, the temperature of the substrate is set to 100° C. or lower to form a reaction layer. In the substrate processing, the temperature of the substrate is set to 100° C. or higher to sublimate the reaction layer. Thus, in the substrate processing according to the present embodiment, it is possible to control the etching amount for removing the silicon-containing film.

For example, in the embodiments, although a case where a processing target substrate is a semiconductor wafer has been described as an example, the present disclosure is not limited thereto. The processing target substrate may be another substrate such as, for example, a glass substrate.

In addition, in the embodiments, although the case where an ICP type plasma processing apparatus is used as the plasma processing apparatus 100 has been described as an example, the present disclosure is not limited thereto. The plasma processing apparatus 100 may be any type of plasma processing apparatus. For example, the plasma processing apparatus 100 may be a capacitively coupled parallel plate plasma processing apparatus. In addition, the plasma processing apparatus 100 may be, for example, a remote source type plasma processing apparatus that supplies radical-rich plasma generated using microwave plasma, magnetron plasma, or a remote source to the processing chamber 102 through, for example, a pipe.

In the explanatory view embodiments, although the case where a wafer W is heated by the heater has been described as an example, the present disclosure is not limited to this. For example, any type of heating method may be used as long as the wafer W can be heated. For example, the wafer W may be heated by, for example, plasma, an infrared lamp, or electron beam irradiation.

In the present embodiment, although the case where the substrate processing is performed using the plasma processing apparatus 100 and the heating apparatus 200 has been described as an example, the present disclosure is not limited thereto. A substrate processing according to the embodiments may be implemented by combining apparatuses other than the plasma processing apparatus 100 and the heating apparatus 200.

In addition, in the substrate processing according to the present embodiment, the case where a silicon-containing film ($SiO_2$) which is the same type as the silicon-containing film such as, for example, $SiO_2$ formed on the wafer W is formed has been described as an example, but the present disclosure is not limited thereto. For example, in the substrate processing, a silicon-containing film different from $SiO_2$ such as, for example, SiN may be formed. For example, in the substrate processing illustrated in FIGS. 6A to 6C, the $SiO_2$ film 20 is formed, but instead of the $SiO_2$ film 20, a SiN film may be formed on the top surface or the side surfaces of the pattern P by forming the SiN film on the wafer W through CVD or ALD. The native oxide film 14 is capable of being removed by performing a CR processing. In addition, the SiN film 12 is covered with a new SiN film.

Therefore, even when the SiN film 12 is damaged, it is possible to suppress the SiN film 12 from being removed by the CR processing.

In the flow of the substrate processing illustrated in FIG. 9, although the case where the preprocessing (step S11) is performed after step S10 has been described as an example, the present disclosure is not limited thereto. For example, the preprocessing (step S11) may be performed before step S10 or may be performed after step S12.

In addition, a substrate processing method according to an embodiment includes providing a processing target substrate having a pattern, forming a film on the substrate, forming a reaction layer on a surface layer of the substrate by plasma, and applying energy to the substrate so as to remove the reaction layer. It has found that various other effects are obtained by this substrate processing method. Hereinafter, the effects will be demonstrated using an example.

Figure 10:
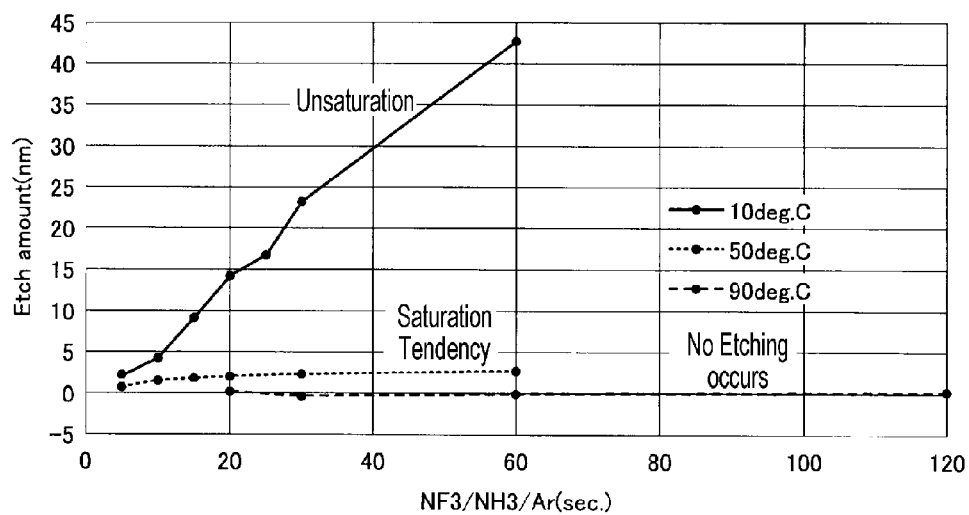
FIG. 10 is a view representing an exemplary change in etching amount depending on a change in the temperature of a wafer according to an embodiment.

For example, the amount of a reaction layer formed through a CR processing is temperature-dependent. Therefore, in the CR processing, the removed amount of the $SiO_2$ film changes in depending on the temperature of the wafer W at the time of forming the reaction layer. FIG. 10 is a view representing an exemplary change in etching amount depending on a change in the temperature of a wafer according to an embodiment. FIG. 10 represents the changes in etching amount with respect to the processing time for producing a reaction layer when the temperature of the wafer W is set to 10° C., 50° C., and 90° C. When the temperature of the wafer W is set to 10° C., the etching amount increases as the processing time is prolonged. Meanwhile, when the temperature of the wafer W is set to 90° C., almost no etching occurs, and the etching amount remains near zero even if the processing time is prolonged. Meanwhile, when the temperature of the wafer W is set to 50° C., when the processing time is short, the etching amount slightly increases depending on the processing time. However, when the processing time is prolonged, the etching amount does not increase, and the etching amount saturates. In the example of FIG. 10, when the temperature of the wafer W is 50° C., the etching amount does not increase after the processing time of 40 seconds, and the etching amount is saturated. Therefore, in the CR processing, it is possible to remove the removed amount of the $SiO_2$ film by controlling the temperature of the wafer W when forming the reaction layer. It is possible to control the etching amount of the $SiO_2$ film with high accuracy by repeating the CR processing in which the temperature of the wafer W during the formation of the reaction layer is set to the temperature at which the etching amount saturates (e.g., 50° C.). In addition, it is possible to control the film thickness of the $SiO_2$ film with high accuracy by combining the film forming processing and the CR processing.

In the CR processing, when the pattern P formed on the $SiO_2$ film 11 of the wafer W is coarse or dense, the etching amount of the pattern P may change in accordance with coarseness or density of the pattern P even if the same processing is performed. In addition, in the CR processing, the etching amount of the pattern P also changes depending on the temperature of the wafer W during the formation of the reaction layer. For example, in the CR processing, when the temperature is low, the width of a coarse pattern P changes more than that of a dense pattern P. When the temperature is high, the width of a dense pattern P changes more than that of a coarse pattern P. Accordingly, in the CR processing, it is possible to control the width of the pattern P by controlling the temperature of the wafer W during the formation of the reaction layer.

In addition, by performing the film forming processing and the CR processing, improvements in line width roughness (LWR) and line edge roughness (LER) of a line-type pattern P are obtained. FIGS. 11A to 11C are views for explaining improvements in LWR and LER of line-type patterns according to an embodiment. FIG. 11A illustrates line-type patterns P. In the film forming processing, a film which is the same type as the patterns P is formed. For example, when the patterns P are formed on a $SiO_2$ film, a $SiO_2$ film is formed through CVD in the film forming processing. In the CVD, a large amount of film is formed in a portion where a width between the patterns P is wide, and a small amount of film is in a portion where a width between the patterns P is narrow. Thus, as illustrated in FIG. 11B, the unevenness on the side surfaces of the line-type patterns P is reduced. However, the width between the patterns P is narrowed by film formation. Therefore, the CR processing is performed on the line-type patterns P. For example, the CR processing is performed in the state in which the temperature of the wafer W during the formation of the reaction layer is set to 50° C. The CR processing etches isotropically. Thus, as illustrated in FIG. 11C, it is possible to return the width between the patterns P to be equal to the initial width. By repeatedly performing the film forming processing and the CR processing illustrated in FIGS. 11A to 11C, it is possible to obtain improvements in LWR and LER of the line-type0 patterns P.

In addition, it is possible to control the shapes of the patterns P by performing the film forming processing and the CR processing. In the film forming processing, a film forming area and a film forming amount differ depending on the film forming method. For example, in the CVD, a large amount of film is formed on the top of a pattern P. In the ALD, a film is uniformly formed. In the CR processing, the upper portion of a pattern P is etched slightly more than the lower portion of the pattern P. Accordingly, it is possible to control the shape of the pattern P by repeating the film forming processing such as, for example, CVD or ALD and the CR processing.

Figures 12A, 12B, 12C:
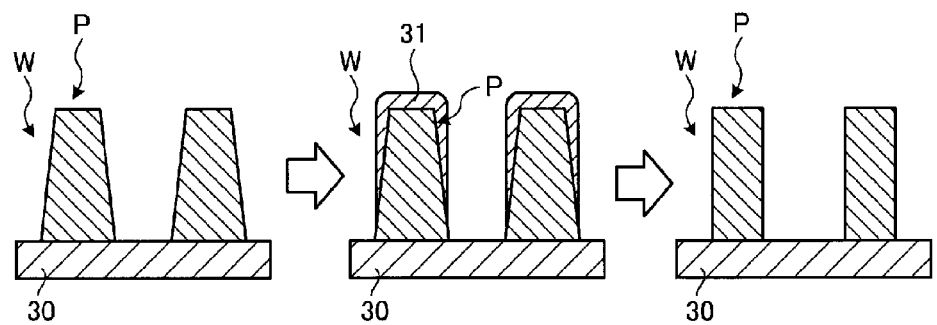
FIGS. 12A to 12C are views illustrating an exemplary change in the shape of patterns according to an embodiment.

FIGS. 12A to 12C are views illustrating an exemplary change in the shape of patterns according to an embodiment. FIG. 12A illustrates a wafer W. In the wafer W, patterns P are provided on a base layer 30 (e.g., a silicon layer). The patterns P are formed on, for example, a $SiO_2$ film. In FIG. 12A, each pattern P has a tapered shape in which the width of the upper portion is smaller than the width of the lower portion. For example, a $SiO_2$ film 31 which is the same type as the pattern P is formed on the wafer W through CVD. In the CVD, the film is formed to be thicker toward the top. As a result, as illustrated in FIG. 12B, the width of the upper portion of the pattern P becomes substantially equal to the width of the lower portion (i.e., the cross section has a rectangular shape). Thereafter, the $SiO_2$ film is subjected to a CR processing. The CR processing etches isotropically and substantially uniformly. As a result, as illustrated in FIG. 12C, it is possible to shape each pattern P such that the upper width and the lower width are substantially equal to each other, and the side surfaces are vertical. Thereafter, an etching target film of a base may be etched.

Figures 13A, 13B, 13C:
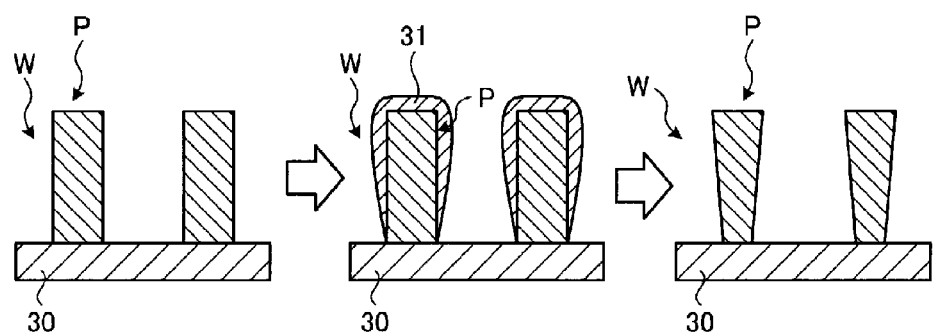
FIGS. 13A to 13C are views illustrating another exemplary change in the shape of patterns according to the embodiment.

FIGS. 13A to 13C are views illustrating another exemplary change in the shape of a pattern according to the embodiment. FIG. 13A illustrates patterns P in the initial state. In each pattern P in the initial state, the width of the upper portion is substantially equal to the width of the lower portion, and the side surfaces are vertical. FIG. 13B illustrates an example of the patterns P in the case where CVD was performed on the patterns P in the initial state. In the CVD, a film is formed to be thicker toward the top portion as the film forming time is prolonged. By appropriately controlling the film forming time of CVD, each pattern P has a reverse tapered shape in which the width of the upper portion is larger than the width of the lower portion. Next, the $SiO_2$ film 32 is subjected to a CR processing. The CR processing etches isotropically and substantially uniformly. As a result, as illustrated in FIG. 13C, it is possible to shape each pattern P to have a reverse tapered shape in which the width of the lower portion becomes smaller than the initial width thereof. An etching target film may be etched using a pattern after the shape thereof is changed.

FIGS. 14A and 14B are views illustrating an exemplary change in the shape of patterns according to an embodiment. In FIG. 14A, patterns P are provided on a base layer 30. In addition, for example, a $SiO_2$ film 31 is formed on the top of each pattern P by performing CVD and CR processings. By forming the $SiO_2$ film 31, each pattern P increases in height in a state in which the width of the upper portion and the width of the lower portion are almost equal to the initial state. When the CR processing is further performed, it is possible to reduce the width of each pattern P as illustrated in FIG. 14B. An etching target film may be etched using a pattern after the shape thereof is changed.

By performing the film forming processing and the CR processing as described above, it is possible to control the shape of the patterns P (the shape of a mask).

In addition, a film formed through a film forming processing such as, for example, a silicon-containing film or an organic film, may be used as a mask for etching. In addition, a film formed through a film forming processing such as, for example, a silicon-containing film or an organic film, may be used as a protective film for etching.

FIGS. 15A to 15C are views illustrating exemplary etching using a film according to an embodiment as a mask. As illustrated in FIG. 15A, a wafer W is provided with an etching target film 40. The etching target film 40 is, for example, a Si film or a SiN film. A mask 41 (e.g., a $SiO_2$ film) is provided on the etching target film 40. A pattern P is formed on the mask 41. For example, a film 42 which the same type as the mask 41 (e.g., a $SiO_2$ film) is formed on the wafer W through CVD or ALD. Thus, it is possible to increase the thickness of the mask 41. The etching target film 40 is etched using the mask 41. When the etching target film 40 is a Si film, etching is performed using a halogen gas. When the etching target film 40 is a Si film, etching is performed using a CHF-based gas. Here, as illustrated in FIG. 15A, since it is possible to increase the thickness of the mask 41, the etching target film 40 may be etched for a longer time. As illustrated in FIG. 15B, the etching target film 40 is etched along the pattern P. Then, the film 42 is removed. For example, a CR processing is performed to remove the $SiO_2$ film. As a result, as illustrated in FIG. 15C, it is possible to remove the $SiO_2$ films such as, for example, the mask 41 and the film 42.

FIGS. 16A to 16C are views illustrating an exemplary etching using a film according to an embodiment as a protective film. As illustrated in FIG. 16A, a wafer W is provided with an etching target film 40. The etching target film 40 is, for example, a Si film or a SiN film. A mask 41 (e.g., a $SiO_2$ film) is provided on the etching target film 40. A pattern P is formed on the mask 41. The etching target film 40 is etched along the pattern P to form a hole H. For example, the film 42 (e.g., a $SiO_2$ film) is formed on the wafer W through ALD. As a result, as illustrated in FIG. 16A, the surface of the mask 41 and the inner surface of the hole H in the etching target film 40 are covered with and protected by the film 42. Then, the wafer W is etched through anisotropic etching. As a result, as illustrated in FIG. 16B, it is possible to etch the hole H more deeply while protecting the side wall of the hole H with the film 42. Then, a CR processing is performed to remove the $SiO_2$ film. As a result, as illustrated in FIG. 16C, it is possible to remove the mask 41 and the film 42.

Next, the flow of a substrate processing including an etching processing as described above will be described. FIG. 17 is a flowchart illustrating another exemplary flow of a substrate processing according to an embodiment. The substrate processing illustrated in FIG. 17 further includes a step of etching the wafer W (step S20) after step S10 illustrated in FIG. 9. Thus, since it is possible to protect the pattern (mask), it is possible to etch the etching target film 40 for a longer time. In addition, it is possible to etch the hole H more deeply while protecting the side wall of the hole H. In addition, in the flow of the substrate processing illustrated in FIG. 17, although a case where step S20 is performed after step S10 is described as an example, the present disclosure is not limited thereto. For example, step S20 may be performed after step S14.

Figure 18A:
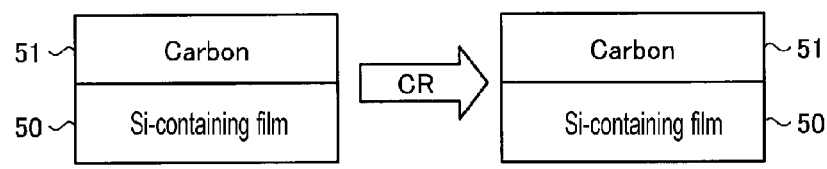
FIG. 18A is a view illustrating an exemplary film serving as an inhibition factor according to an embodiment.
Figure 18B:
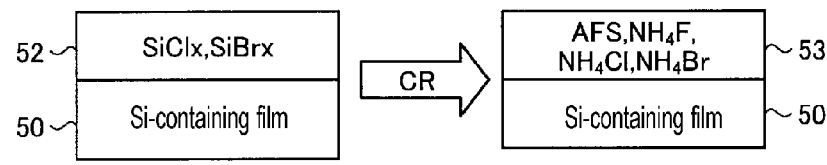
FIG. 18B is a view illustrating another exemplary film serving as an inhibition factor according to an embodiment.

In the CR processing, the silicon-containing film such as, for example, a $SiO_2$ film is etched by forming a reaction layer (AFS) on the silicon-containing film and sublimating the reaction layer. However, in a case where a film that becomes an inhibition factor that inhibits the formation of the reaction layer or the sublimation of the reaction layer is formed on the silicon-containing film, the etching of the silicon-containing film is inhibited in the CR processing. FIG. 18A is a view illustrating an exemplary film serving as an inhibition factor according to an embodiment. For example, it is impossible to form AFS on a carbon film. Therefore, when a film of carbon (hereinafter also referred to as a "carbon film") 51 is formed on a silicon-containing film 50, the etching of the silicon-containing film 50 is inhibited because AFS is not formed even if the CR processing is performed. FIG. 18B is a view illustrating another exemplary film serving as an inhibition factor according to an embodiment. For example, when a gas of $SiCl_4$ or $SiBr_4$ is supplied, a film 52 of $SiCl_x$ or $SiBr_x$ is formed on the silicon-containing film 50. In the case where the film 52 of $SiCl_x$ or $SiBr_x$ is formed on the silicon-containing film 50, when $NF_3$ gas, $NH_3$ gas, or Ar gas is supplied to form AFS, the film 52 is modified to a film made of a hardly volatilized substance such as, for example, $NH_4F$, $NH_4Cl$, or $NH_4Br$ together with AFS. Therefore, when a film 52 of $SiCl_x$ or $SiBr_x$ is formed on the silicon-containing film 50, the etching of the silicon-containing film 50 is inhibited because the AFS is hardly volatilized even if the CR processing is performed.

FIGS. 19A to 19C are views illustrating an exemplary change in the shape of patterns depending on a CR processing according to an embodiment. FIG. 19A illustrates an exemplary wafer W. In the wafer W, a $SiO_2$ film 32 is provided on a base layer 39 (e.g., a silicon layer 10) serving as a base. Patterns P are formed on the $SiO_2$ film 32. FIGS. 19A to 19C illustrate a change in the shape of patterns P due to a CR processing when the wafer W is not provided with a film that serves as an inhibition factor. In the CR processing, various gases such as, for example, $NF_3$ gas, $NH_3$ gas, and Ar gas are introduced, and plasma is generated. As a result, as illustrated in FIG. 19B, an AFS layer 33 is formed on the $SiO_2$ film 32. Then, in the CR processing, the layer 33 of AFS is removed by heating the wafer W. As a result, as illustrated in FIG. 19C, the $SiO_2$ film 32 is etched to make the patterns P smaller as a whole, so that the width between the patterns P becomes wider.

FIGS. 20A to 20D are views illustrating an exemplary change in the shape of patterns depending on a film forming processing and a CR processing according to an embodiment. FIG. 20A illustrates a wafer W having patterns P formed thereon as in FIG. 19A. FIGS. 20A to 20D illustrate a change in the shape of patterns due to a CR processing in the case when a film that serves as an inhibition factor is formed. For example, plasma is generated while supplying a gas of $CH_4$ or Ar, and a carbon film 51 is formed on the wafer W as a film that serves as an inhibition factor as illustrated in FIG. 20B. The carbon film 51 may be formed through ALD. When the CR processing is performed on the wafer W on which the carbon film 51 is formed, etching is not performed as illustrated in FIG. 20C since the AFS is not formed on the carbon film 51. It is possible to remove the carbon film 51 as illustrated in FIG. 20D by generating plasma while supplying $O_2$ gas.

Figure 21:
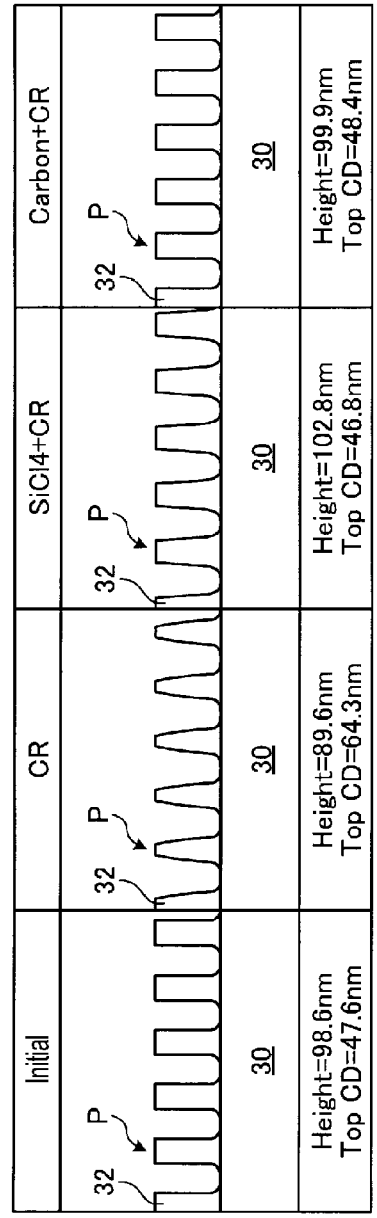
FIG. 21 is a view illustrating an exemplary change of a pattern depending on a film forming processing and a CR processing according to an embodiment.

FIG. 21 is a view representing an exemplary change of a pattern depending on a film forming processing and a CR processing according to an embodiment. Column "Initial" in FIG. 21 represents the initial shape of patterns P formed on a wafer W. In addition, the height of the pattern P is also represented. Furthermore, the width between the patterns P at the top of the patterns P is represented as a top critical dimension (Top-CD).

Column "CR" in FIG. 21 represents a change in the shape of the patterns P when a CR processing is performed without providing a film that serves as an inhibition factor. Column "CR" represents a result obtained by performing the CR processing for 5 cycles. In Column "CR," the height of the patterns P decreases from the initial state. Furthermore, in Column "CR", since the width of the patterns P decreases from the initial state, the width between the patterns P (Top-CD) increases from the initial state.

Column "SiCl4+CR" in FIG. 21 represents a change in the shape of the patterns P when a film of $SiCl_x$ is formed as a film that serves as an inhibition film and a CR processing is performed. Column "SiCl4+CR" represents a result obtained by performing five cycles of forming a SiCl film on a $SiO_2$ film 32 by generating plasma while supplying $SiCl_4$ gas and then removing the SiCl film by performing a CR processing and generating plasma while supplying $O_2$ gas as one cycle. In Column "SiCl4+CR," the height of the pattern P slightly increases from the initial state due to the film formation of SiCl. Furthermore, in Column "SiCl4+CR," since the width between the patterns P also slightly increases in the lateral direction due to the film formation of $SiCl_x$ the width between the patterns P (Top-CD) slightly decreases from the initial state.

Column "Carbon+CR" in FIG. 21 represents a change in the shape of the patterns P when a carbon film is formed as a film that serves as an inhibition film and a CR processing is performed. Column "Carbon+CR" represents a result obtained by performing five cycles of forming a carbon film on a $SiO_2$ film 32 by generating plasma while supplying $SiCl_4$ gas and then removing the carbon film by performing a CR processing and generating plasma while supplying $O_2$ gas as one cycle. In Column "Carbon+CR," the height of the patterns P and the width between the patterns P are almost the same as those in the initial state.

Figure 22:
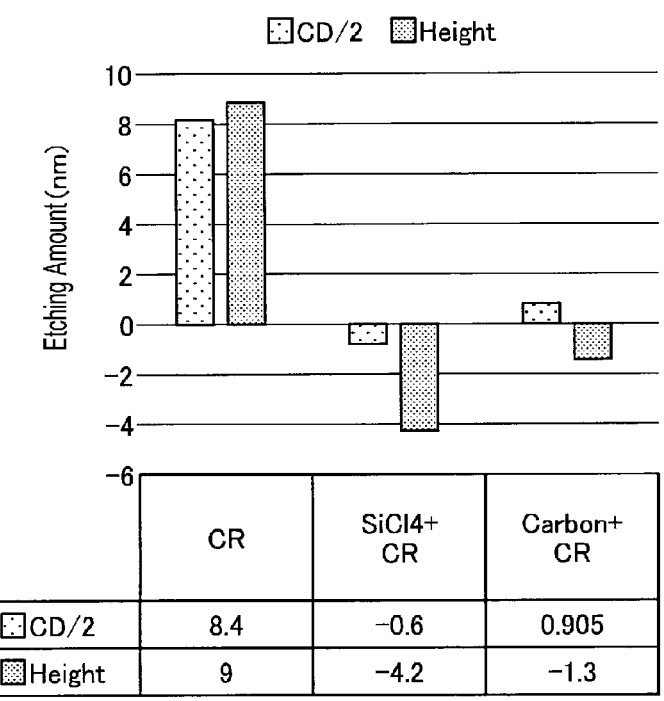
FIG. 22 is a view illustrating an exemplary change in the height and width of patterns according to an embodiment.

FIG. 22 is a view illustrating an exemplary change in the height and width of patterns according to an embodiment. In the lower part of FIG. 22, change amounts in the height of the patterns P and change amounts in the width (CD/2) from those in Column "Initial" for Columns "CR," "SiCl4+CR," and "Carbon+CR" represented in FIG. 21 are represented.

Since each patterns P is etched on both side surfaces thereof, the change amount in the width of the pattern P is set to a half value of the change amount in the width (Top-CD) between patterns P from that in Column "Initial." In the upper part of FIG. 22, change amounts in the height of the patterns P (Height) and change amounts in the width (CD/2) from those in Column "Initial" for Columns "CR," "SiCl4+CR," and "Carbon+CR" represented in FIG. 22 are represented as etching amounts. For example, in Column "CR", the change amount in the height of the patterns P (Height) is 9 nm, the change amount in the width of the patterns P (CD/2) is 8.4 nm, and the patterns P are etched either in the longitudinal direction or the lateral direction. In Column "SiCl4+CR," the change amount in the height of patterns P (Height) is −4.2 nm, the change amount in the width of patterns P (CD/2) is −0.6 nm, and patterns P increase in the vertical direction due to the film formation of $SiCl_x$. In Column "Carbon+CR," the change amount in the height of patterns P (Height) is 0.905 nm, the change amount in the width of pattern P (CD/2) is −1.3 nm, and since the changes in the height of patterns P and the width between patterns P are small, the etching of the patterns P is inhibited.

Figure 23:
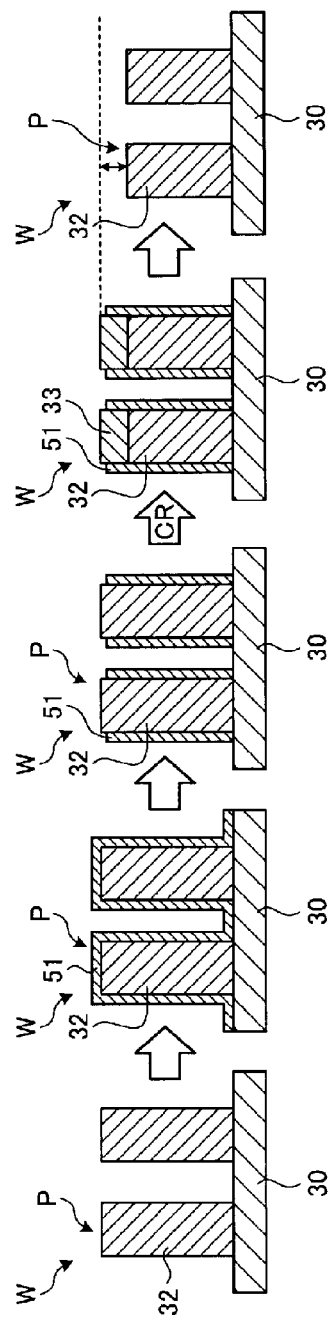
FIGS. 23A to 23E are views illustrating an exemplary change in the shape of a pattern depending on a film forming processing and a CR processing according to an embodiment.

In the substrate processing according to the embodiment, it is possible to control the shape of patterns P by performing the CR processing after forming a film that serves as such an inhibition factor. FIGS. 23A to 23E are views illustrating an exemplary change in the shape of patterns depending on a film forming processing and a CR processing according to an embodiment. FIG. 23A illustrates a wafer W having patterns P formed thereon as in FIG. 19A. For example, plasma is generated while supplying a gas of $CH_4$ or Ar, and a carbon film 51 is formed on the wafer W as a film that serves as an inhibition factor as illustrated in FIG. 23B. The carbon film 51 may be formed through ALD. Then, by generating plasma by introducing $O_2$ gas, the carbon film 51 on the top of the patterns P is removed. The plasma generated by the $O_2$ gas etches the carbon film 51 from the top side of the patterns P. Therefore, it is possible to remove the carbon film 51 on the top of the patterns P by adjusting the conditions such as a plasma processing time, as illustrated in FIG. 23C. A CR processing is performed on the wafer W from which the carbon film 51 on the top of the patterns P has been removed as described above. In the CR processing, as illustrated in FIG. 23D, an AFS layer 33 is formed on the top of the patterns P from which the carbon film 51 has been removed. Therefore, the top sides of the patterns P are etched. Then, by generating plasma while supplying $O_2$ gas, the carbon film 51 is removed. As a result, as illustrated in FIG. 23E, it is possible to reduce the height of the patterns P without substantially changing the width of the patterns P.

Figure 24:
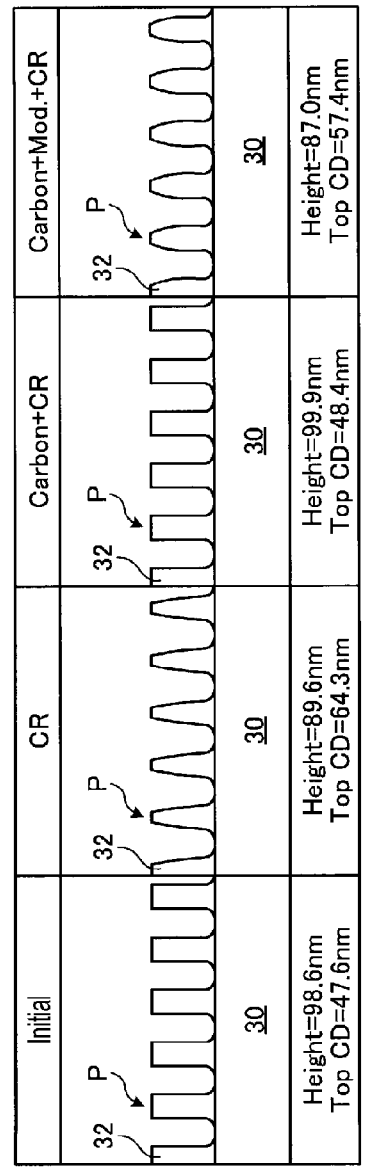
FIG. 24 is a view illustrating an exemplary change of a pattern depending on a film forming processing and a CR processing according to an embodiment.

FIG. 24 is a view representing an exemplary change of a pattern depending on a film forming processing and a CR processing according to an embodiment. FIG. 24 represents changes in the shapes of the patterns P in Columns "Initial," "CR," and "Carbon+CR" represented in FIG. 21.

Column "Carbon+Mod.+CR" in FIG. 24 represents a change in the shape of each pattern P when a carbon film 51 is formed as a film that serves as an inhibiting factor, the carbon film 51 on the upper part of the pattern P is removed, and a CR processing is performed, as illustrated in FIGS. 23A to 23E. In Column "Carbon+Mod.+CR," the height of each pattern P decreases from the initial state. In Column "Carbon+Mod.+CR," since the width of each patterns P slightly decreases from the initial state, the width between the patterns P slightly increases from the initial state. This is because the carbon film 51 on the top of each pattern P is removed and thus the side surfaces on the top of each pattern P are also etched. As illustrated in FIGS. 23A to 23E, in Column "Carbon+Mod.+CR", the width decreases at the top of each pattern P.

Figure 25:
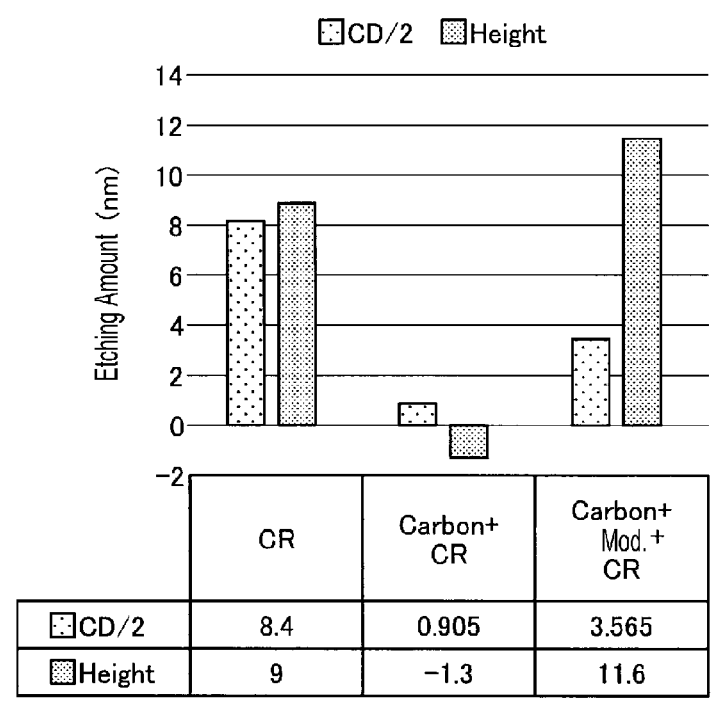
FIG. 25 is a view illustrating an exemplary change in the height and width of patterns according to an embodiment.

FIG. 25 is a view illustrating an exemplary change in the height and width of patterns according to an embodiment. In the lower part of FIG. 25, change amounts in the height of the patterns P and change amounts in the width (CD/2) from those in Column "Initial" for Columns "CR," "Carbon+CR," and "Carbon+Mod.+CR" represented in FIG. 24 are represented. Columns "CR" and "Carbon+CR" represent the same as those in FIG. 22. In the upper part of FIG. 24, change amounts in the height of the patterns P (Height) and change amounts in the width (CD/2) from those in Column "Initial" for Columns "CR," "Carbon+CR," and "Carbon+Mod.+CR" represented in FIG. 22 are represented as etching amounts. For example, in Column "Carbon+Mod.+CR", the change amount in the height of the patterns P (Height) is 11.6 nm, the change amount in the width of the patterns P (CD/2) is 3.565 nm, and the patterns P are etched more greatly in the longitudinal direction than in the lateral direction. As described above, by performing a film forming process and a CR processing of a film that serves as an inhibition factor, it is possible to etch patterns P more greatly in the longitudinal direction than in the lateral direction, and thus it is possible to control the shape of the patterns P (the shape of a mask).

In the plasma processing apparatus 100 according to the embodiments described above, a case where the temperature of a wafer W is controlled by providing one heater 111 on the entire placement surface of the stage 110 on which the wafer W is placed is described as an example, but the present disclosure is not limited thereto. The placement surface of the stage 110 may be divided into a plurality of zones, and a heater 111 may be provided in each zone to control the temperature of a wafer W for each zone. The placement surface of the stage 110 may be divided concentrically, and may be further divided in the circumferential direction. FIG. 26 is a view illustrating exemplary zone division of the placement surface of a stage according to an embodiment. FIG. 26 illustrates the placement surface 115 of the stage 110. A wafer W is placed on the placement surface 115. The placement surface 115 is divided into a plurality of zones 116. In the example of FIG. 26, the placement surface 115 is divided concentrically and further divided in the circumferential direction. In the film forming processing and the CR processing, the film forming amount and the etching amount change depending on the temperature. Thus, by dividing placement surface 115 into the plurality of zones 116 and controlling the temperature of the wafer W for each zone 116, it is possible to control the shape of patterns P for each area of the wafer W corresponding to each zone 116. For example, in the film forming processing, the CDs of patterns P often vary in the center and the edge of a wafer W. Therefore, by controlling the temperature of each zone 116 of the placement surface 115 of the stage 110 so as to reduce a variation in CD, it is possible to make the CDs of formed patterns P uniform. The temperature control is not limited to the control for making the CDs of patterns P uniform, but may be performed so as to intentionally make the CDs of the pattern P nonuniform. For example, when the CDs of patterns P become uneven in the center and edge of the wafer W in a post process, the temperature of each zone 116 may be controlled such that the CDs of the patterns P are not uniform in the center and edge of the wafer W in order to make the CDs of the patterns P uniform after the post process.

FIGS. 27A and 27B are views for explaining an exemplary relationship between the temperature and the film forming amount of a processing target according to an embodiment. A wafer W to be processed in the substrate processing apparatus is, for example, a disk shape having a diameter of about 300 mm. It is known that when a film forming process is performed on the wafer W, a film forming amount varies depending on the temperature of the wafer W. FIG. 27A represents a relationship between a film forming amount and the temperature of a wafer W. As illustrated in FIG. 27A, the film forming amount increases as the temperature of the wafer W increases, and decreases as the temperature of the wafer W decreases.

Meanwhile, it is known that during a processing such as, for example, etching, a shape abnormality (e.g., bowing) is small in the central portion of the wafer W, and the shape abnormality tends to be large in the edge portion of the wafer W.

Therefore, the temperature of each zone 116 of the stage 110 is controlled such that the temperature of the central portion in which the shape abnormality tends to be small is lower than the edge portion in which the shape abnormality tends to be large. With this control, it is possible to adjust the film thickness of the formed film depending on the radial position of the wafer W, and thus, it is possible to improve the in-plane uniformity of the formed film.

Furthermore, as illustrated in FIG. 27B, for the purpose of film thickness control, a plurality of zones divided in the radial direction and circumferential direction are provided to enable temperature control independently of each other. Thus, it is possible to use temperature control, besides the improvement of in-plane uniformity. For example, it is also possible to implement a processing such as, for example, changing the thickness of a film to be formed for each position of the wafer W.

According to the present disclosure, it is possible to control the pattern formed on the substrate to a desired state.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
    forming a film on a substrate having a pattern using plasma, wherein the film includes a silicon-containing film, and wherein forming of the film is controlled to control a film forming area and to control a film forming amount in the film forming area;
    after forming of the film, generating plasma in a processing chamber where the substrate is disposed to form a reaction layer on a surface of the film, wherein the reaction layer includes ammonium fluorosilicate; and
    applying energy to the substrate where the reaction layer is formed on the surface of the film to remove the reaction layer,
    wherein, in the generating of the plasma, the substrate is set to be 100° C. or lower, and
    in the applying energy to the substrate, the substrate is set to be 100° C. or higher,
    the method further including changing a size and/or shape of the pattern by removing a portion of the pattern.

2. A substrate processing method comprising:
    forming a film on a substrate having a pattern;
    after forming of the film, generating plasma in a processing chamber where the substrate is disposed to form a reaction layer on a surface of the film; and
    applying energy to the substrate where the reaction layer is formed on the surface of the film to remove the reaction layer,
    wherein, in the substrate, the pattern is formed on a first $SiO_2$ film provided on a silicon layer to reach the silicon layer, a top surface of the first $SiO_2$ film and a side surface of the pattern are covered with a SiN film, and a native oxide film is formed on the silicon layer at a bottom of the pattern,
    wherein in the forming of the film, a second $SiO_2$ film is formed at least on the side surface of the pattern,
    wherein in the generating of the plasma, the plasma is generated while supplying a reaction gas in the processing chamber, and the second $SiO_2$ film and the native oxide film are reacted with the reaction gas to form the reaction layer, and
    wherein in the applying of energy to the substrate, the native oxide film is removed by removing the reaction layer.

3. The method according to claim 1, wherein, in the forming of the film, a silicon-containing film, which is the same kind as the silicon-containing film formed on the substrate, is formed.

4. The method according to claim 1, wherein, in the forming of the film, a silicon-containing film which is different from the silicon-containing film formed on the substrate is formed.

5. The method according to claim 1, further comprising:
    etching the substrate after applying of the energy to the substrate.

6. A substrate processing method comprising:
    forming a pattern in a first silicon-containing film that is formed on a silicon layer of a substrate thereby causing a native oxide film to be formed on the silicon layer at a bottom of the pattern;
    covering a top surface of the first silicon-containing film and a side surface of the pattern with a SiN film;
    forming a second silicon-containing film at least on the side surface of the pattern;
    generating plasma in a processing chamber where the substrate is disposed to form a reaction layer on a surface of the second silicon-containing film; and
    applying energy to the substrate where the reaction layer is formed on the surface of the second silicon-containing film to remove the reaction layer.

7. The method according to claim 6,
    wherein, in the generating of the plasma, the plasma is generated while supplying a reaction gas in the processing chamber, and the second silicon-containing film and the native oxide film are reacted with the reaction gas to form the reaction layer, and
    wherein, in the applying of energy to the substrate, the native oxide film is removed by removing the reaction layer.

8. The method according to claim 1,
    wherein the film is formed through plasma enhanced chemical vapor deposition (PE-CVD).

9. The method according to claim 1,
    wherein the film is formed through unsaturated atomic layer deposition (ALD).

10. The method according to claim 8,
wherein the film has a nonuniform thickness.

11. The method according to claim 9,
wherein the film has a nonuniform thickness.

12. The method according to claim 8,
wherein the film is formed substantially on the top of the pattern.

13. The method according to claim 8,
wherein the film is formed to be thicker at a top of the pattern than at other portions of the pattern.

14. The method according to claim 9,
wherein the film is formed to be thicker at a top of the pattern than at other portions of the pattern.

15. The method according to claim 1,
wherein a cross-sectional shape of the pattern before forming of the film is different from a cross-sectional shape of the pattern after removing of the reaction layer.

16. The method according to claim 1,
wherein the pattern includes $SiO_2$.

17. The method according to claim 1,
wherein an inductively coupled plasma (ICP) is used.

18. The method of claim 1, further including using $NH_3$ to form the reaction layer.

19. The method of claim 1, wherein the reaction layer is removed isotropically.

20. The method of claim 1, wherein in the changing of the size and/or shape of the pattern by removing a portion of the pattern, the size and/or shape of the pattern is changed compared to immediately prior to the forming of the film.

* * * * *